United States Patent
Yoshida et al.

(10) Patent No.: US 6,246,013 B1
(45) Date of Patent: Jun. 12, 2001

(54) SURFACE MOUNTING STRUCTURE AND SURFACE MOUNT TYPE ELECTRONIC COMPONENT INCLUDED THEREIN

(75) Inventors: Ryuhei Yoshida; Tsuneo Amano, both of Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/536,973

(22) Filed: Mar. 28, 2000

(30) Foreign Application Priority Data

Mar. 30, 1999 (JP) .................................. 11-090160

(51) Int. Cl.$^7$ ................ H05K 1/16; H05K 1/14
(52) U.S. Cl. ............ 174/260; 174/52.1; 174/255; 174/259; 174/261; 174/262; 310/311; 310/348; 310/365; 361/301.1; 361/760; 361/807
(58) Field of Search ................. 174/260, 250, 174/68.1, 52.1, 52.3, 52.4, 262, 261, 255, 259; 361/760, 748, 761, 807, 777, 809, 301.1, 793, 794; 310/348, 365, 311, 321; 333/246, 247; 29/832, 829, 25.35, 825, 739, 741

(56) References Cited

U.S. PATENT DOCUMENTS

| | | | |
|---|---|---|---|
| 5,162,613 | * 11/1992 | Schoenthaler | 174/88 R |
| 5,400,221 | * 3/1995 | Kawaguchi | 361/771 |
| 5,768,109 | * 6/1998 | Gullick et al. | 361/794 |
| 5,780,776 | * 7/1998 | Noda | 174/255 |
| 5,880,553 | * 3/1999 | Okeshi et al. | 310/352 |
| 5,900,790 | * 5/1999 | Unami et al. | 333/187 |
| 5,901,046 | * 5/1999 | Ohta et al. | 361/760 |
| 6,002,592 | * 12/1999 | Nakamura et al. | 361/760 |
| 6,048,433 | * 4/2000 | Maesaka et al. | 156/314 |

* cited by examiner

Primary Examiner—Jeffrey Gaffin
Assistant Examiner—I. B. Patel
(74) Attorney, Agent, or Firm—Keating & Bennett, LLP

(57) ABSTRACT

A surface mounting structure is arranged to minimize a height dimension of an electronic component. A surface mount type electronic component is provided on the surface mounting structure. The surface mount type electronic component includes a piezoelectric component element including an insulating substrate, and a piezo-resonator mounted on a mounting surface of the insulating substrate. The piezoelectric component element is mounted on a printed circuit board, with the mounting surface being arranged to face a surface of the printed circuit board. A recess is formed in the printed circuit board and a portion of the piezoelectric component element is accommodated in the recess. A conductive adhesive is located on external connection electrodes provided on the mounting surface and is firmly attached to circuit patterns on the printed circuit board so that the piezoelectric component element is fixed to the printed circuit board. Further, the external connection electrodes are electrically connected to the circuit patterns.

19 Claims, 5 Drawing Sheets

SURFACE MOUNTING STRUCTURE AND SURFACE MOUNT TYPE ELECTRONIC COMPONENT INCLUDED THEREIN

BACKGROUND OF THE INVENTION

1. Field of the Invention

The present invention relates to a surface mounting structure and a surface mount type electronic component included in the surface mounting structure.

2. Description of Related Art

As an example of a conventional surface mount type electronic component, a piezoelectric component is known to be formed by sandwiching between two external substrates a piezoelectric substrate having an oscillation electrode disposed thereon. The external substrates define with the piezoelectric substrate an enclosed oscillation space and protects the piezoelectric substrate from mechanical stress.

In another type of known surface mounting type piezoelectric component, a piezoelectric substrate having an oscillation electrode disposed thereon is firmly attached to a base substrate, and a cover member is arranged to cover the piezoelectric substrate. The cover member defines with the base substrate an enclosed oscillation space and protects the piezoelectric substrate from external mechanical stress.

In the conventional surface mount type piezoelectric components, however, the piezoelectric resonator is covered, for example, with external substrates or a cover member having an enclosing function and other space defining functions, so that the height of the product is rather large. Thus, when this piezoelectric component is mounted on a printed circuit board or other substrate, the height of the entire device is rather high, so that it is not a surface mounting structure suitable for achieving a reduction in height. Further, since the thickness of the piezoelectric resonator differs depending on the specifications such as resonance frequency, it is difficult to achieve a uniform height dimension of such components.

SUMMARY OF THE INVENTION

To overcome the above described problems, preferred embodiments of the present invention provide a surface mounting structure suitable for achieving minimizing height and a surface mount type electronic component for use in the surface mounting structure.

One preferred embodiment of the present invention provides a surface mounting structure including a first substrate having an external connection electrode on a mounting surface thereof, an electronic component element mounted on the mounting surface of the first substrate and electrically connected to the external connection electrode, and a second substrate on which the first substrate is mounted and which is provided with a circuit pattern that is electrically connected to the external connection electrode, wherein the first substrate is secured to the second electrode and the external connection electrode of the first substrate is electrically connected to the circuit pattern of the second substrate, with the mounting surface of the first substrate being arranged on the second substrate side.

Examples of the materials and members used to secure the first substrate to the second substrate and to electrically connect the external connection electrode of the first substrate to the circuit pattern of the second substrate include an anisotropic conductor and a conductive adhesive. Other suitable materials and members can also be used.

As a result of the unique arrangement and construction described above, the second substrate achieves the enclosing function and the protecting function of the cover member of the surface mount type electronic component and a component of the covering substrate. Thus, it is possible to omit the cover member which is necessary in conventional components, thereby achieving a very significant reduction in the height of the entire surface mounting structure.

Further, by providing the first substrate with a recess for accommodating at least a portion of an electronic component element or by providing the second substrate with a recess, a through-hole, or such opening member, for accommodating at least a portion of an electronic component element, the visible and effective height of the electronic component element is reduced, and the height of the entire surface mounting structure is therefore greatly reduced.

Other features, elements, advantages and characteristics of the present invention will be described in more detail and will become apparent from the detailed description of preferred embodiments of the present invention and the attached drawings.

DETAILED DESCRIPTION OF PREFERRED EMBODIMENTS

Preferred embodiments of the surface mounting structure of the present invention and the surface mount type electronic component included in the surface mounting structure will now be described with reference to the accompanying drawings. While in the following description the mounting structure of a piezoelectric component is provided as an example, the present invention is also applicable to other types of surface mount type electronic components, such as inductors, capacitors and resistors and other components.

Figure 1:
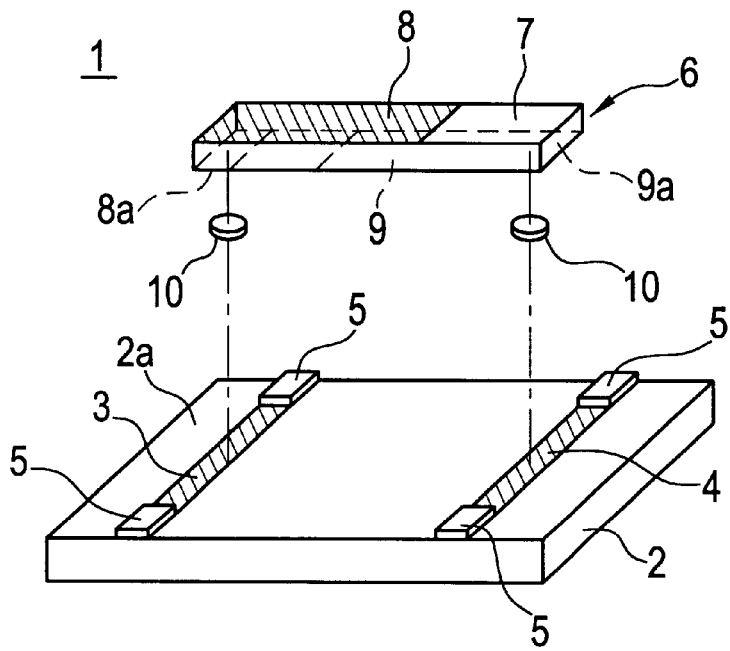
FIG. 1 is an exploded perspective view showing a surface mount type electronic component according to a first preferred embodiment of the present invention.

As shown in FIG. 1, a surface mounting type piezoelectric component 1 preferably includes an insulating substrate 2, and a piezo-resonator 6 mounted on the insulating substrate 2. At the right-hand and left-hand ends of the mounting surface 2a of the insulating substrate 2, there are provided external connection electrodes 3 and 4 extending from the front to the rear side thereof. Conductive adhesive portions 5 are preferably provided at the ends of the external connection electrodes 3 and 4 (in other words, at the edges of the insulating substrate 2). The material used to form the conductive adhesive portions 5 is preferably solder, conductive paste or other suitable material, and the material of the insulating substrate 2 is preferably glass epoxy, alumina, resin or other suitable material.

The piezo-resonator 6 preferably includes a piezoelectric substrate 7, and oscillation electrodes 8 and 9 disposed on opposite major surfaces of the piezoelectric substrate 7. A lead-out portion 8a of the oscillation electrode 8 extends around one end portion of the piezoelectric substrate 7 to the opposite side. A lead-out portion 9a of the oscillation electrode 9 extends at the other end of the piezoelectric substrate 7. Examples of the material used to form the piezoelectric substrate 7 preferably includes a ceramic such as PZT, quartz, and LiTaO3. This piezo-resonator 6 preferably utilizes thickness slide oscillation mode. While in the piezo-resonator 6, a single resonator is preferably provided on a single piezoelectric substrate, it is also possible to have a plurality of resonators mounted on a single piezoelectric substrate. The piezo-resonator 6 is fastened to the mounting surface 2a of the insulating substrate 2 preferably via a conductive adhesive 10, and the lead-out portion 8a of the oscillation electrode 8 is electrically connected to the approximate central portion of the external connection electrode 3, the lead-out portion 9a of the oscillation electrode 9 being electrically connected to the central portion of the external connection electrode 4.

Figure 2:
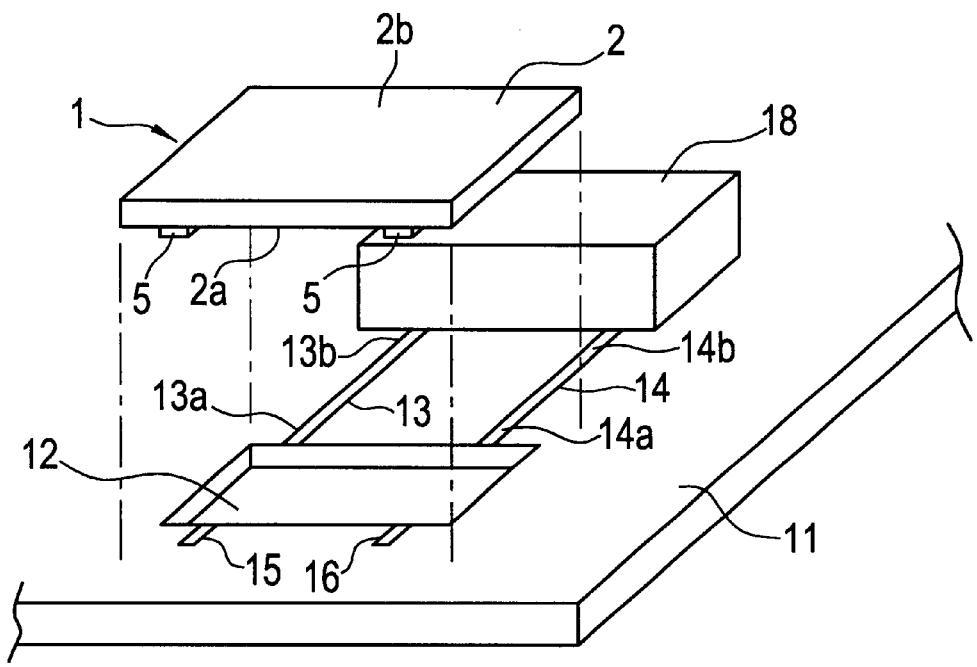
FIG. 2 is a perspective view showing the mounting structure of the surface mount type electronic component shown in FIG. 1.
Figure 3:
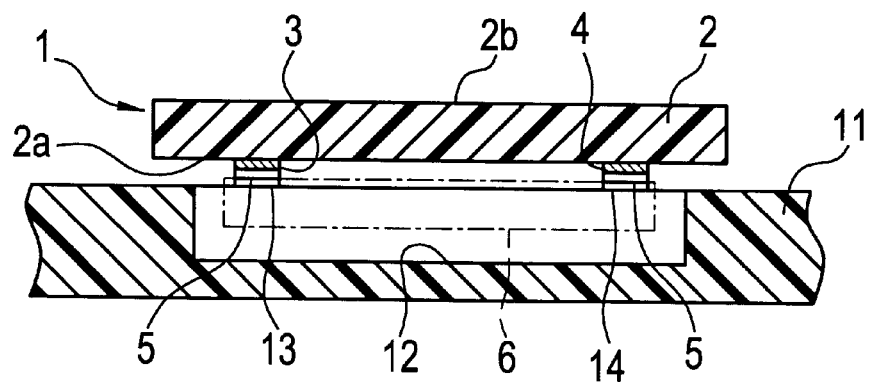
FIG. 3 is a vertical sectional view of the mounting structure of the surface mount type electronic component shown in FIG. 2.

As shown in FIGS. 2 and 3, the surface mounting type piezoelectric component 1, constructed as described above, is mounted on a printed circuit board 11, with the mounting surface 2a on which the piezo-resonator 6 is mounted being arranged to face a surface of the printed circuit board 11. When mounting this piezoelectric component 1 by using an automatic mounting machine, the flat top surface 2b of the piezoelectric component 1 can be held by a suction nozzle, so that automatic mounting can be effected reliably and in a stable manner.

A recess 12 is preferably provided in the printed circuit board 11, and a portion of the piezo-resonator 6 is accommodated in this recess 12. The longitudinal and lateral dimensions of the recess 12 are preferably larger than those of the piezo-resonator 6 and smaller than those of the insulating substrate 2. Further, circuit patterns 13 and 14 and dummy patterns 15 and 16 extend onto the printed circuit board 11 from the recess 12. The conductive adhesive portions 5 are fixed to the ends 13a and 14a of the circuit patterns 13 and 14 and the dummy patterns 15 and 16. At the same time, the external connection electrodes 3 and 4 are electrically connected to the ends 13a and 14a of the circuit patterns 13 and 14. In this way, the external connection electrodes 3 and 4 and the opposing portions of the circuit patterns 13 and 14 are electrically connected via the conductive adhesive portions 5, whereby the electrodes are not exposed on the top surface 2b of the piezoelectric component 1, and problems such as undesired short-circuiting or the like are prevented. The other ends 13b and 14b of the circuit patterns 13 and 14 are electrically connected to an IC (integrated circuit) component 18 mounted on the printed circuit board 11.

In the surface mounting structure constructed as described above, the piezo-resonator 6 of the piezoelectric component 1 is preferably arranged between the insulating substrate 2 and the printed circuit board 11, and an oscillation space for the piezo-resonator 6 is defined by the insulating substrate 2 and the printed circuit board 11. That is, the printed circuit board 11 also functions as a cover and protector of the piezo-resonator 6. Thus, it is possible to omit the conventionally used cover member, so that the height of the entire surface mounting structure is minimized. Further, since the recess 12 for accommodating the piezoelectric component 1 is provided in the printed circuit board 11, the effective height of the piezoelectric component 1 is greatly reduced, whereby the height of the entire surface mounting structure is minimized.

Figure 4:
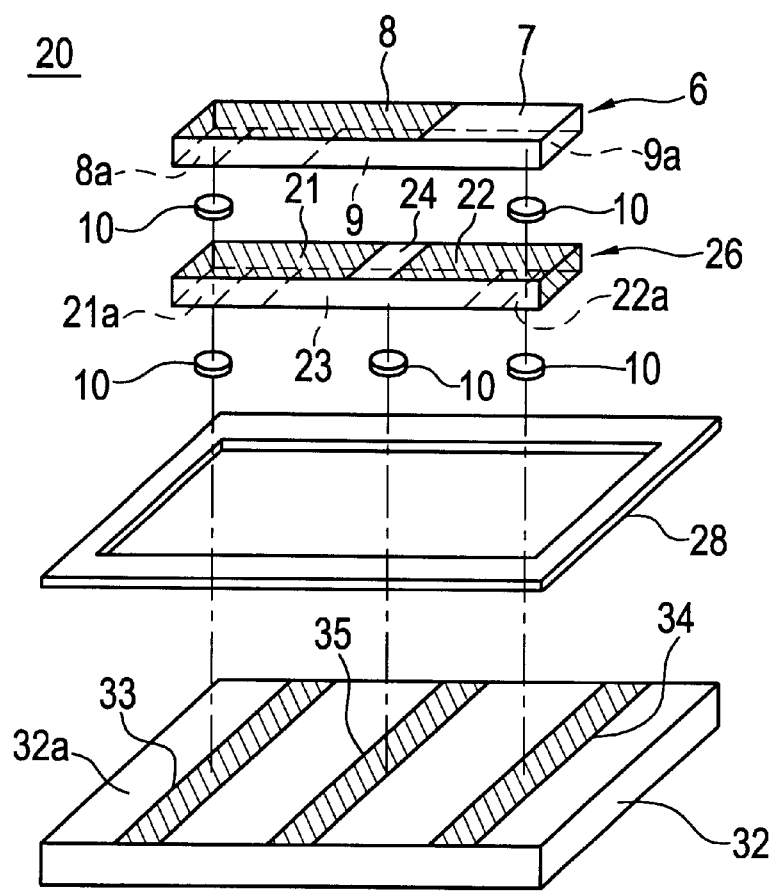
FIG. 4 is an exploded perspective view showing a surface mount type electronic component according to a second preferred embodiment of the present invention.

The second preferred embodiment will be described with reference to a three terminal piezoelectric component including a capacitor. As shown in FIG. 4, a surface mounting type piezoelectric component 20 preferably includes an insulating substrate 32, a piezo-resonator 6 and a capacitor element 26 mounted on the insulating substrate 32, and a frame-shaped anisotropic conductor 28. In the right-hand and left-hand portions and the approximate central portion of the mounting surface 32a of the insulating substrate 32, there are respectively provided external connection electrodes 33, 34 and 35. The anisotropic conductor 28 is arranged along the outer periphery of the insulating substrate 32, and the end portions of the external connection electrodes 33 through 35 are electrically connected to the anisotropic conductor 28. The anisotropic conductor 28 is integrally mounted on the insulating substrate 32 such that its conducting direction is substantially perpendicular to the insulating substrate 32.

The capacitor element 26 preferably includes a dielectric substrate 24, and capacity electrodes 21, 22 and 23 provided on opposite major surfaces of the dielectric substrate 24. The lead-out portion 21a of the capacity electrode 21 extends around one end portion of the dielectric substrate 24 to the opposite side. The lead-out portion 22a of the capacity electrode 22 extends around the other end portion of the dielectric substrate 24 to the opposite side. In the portion where the capacity electrodes 21 and 23 are opposed to each other and in the portion where the capacity electrodes 22 and 23 are opposed to each other, capacitors C1 and C2 are provided, respectively. The piezo-resonator 6 is preferably similar to that described with reference to the first preferred embodiment, so a detailed description thereof will be omitted.

The capacitor element 26 and the piezo-resonator 6 are fixed to the mounting surface 32a of the insulating substrate 32 preferably via a conductive adhesive 10 or other suitable connecting material. At the same time, the lead-out portion 8a of the oscillation electrode 8 and the lead-out portion 21a of the capacitor electrode 21 are electrically connected to the approximate central portion of the external connection electrode 33, the lead-out portion 9a of the oscillation electrode 9 and the lead-out portion 22a of the capacitor electrode 22 are electrically connected to the approximate central portion of the external connection electrode 34, and the capacitor electrode 23 is electrically connected to the approximate central portion of the external connection electrode 35.

Figure 5:
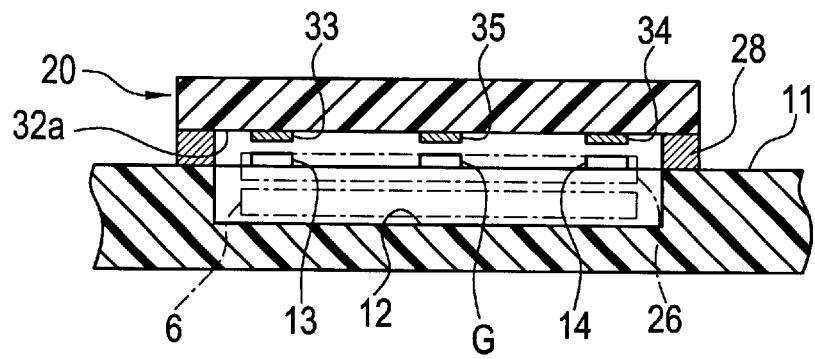
FIG. 5 is a vertical sectional view showing the mounting structure of the surface mount type electronic component shown in FIG. 4.
Figure 6:
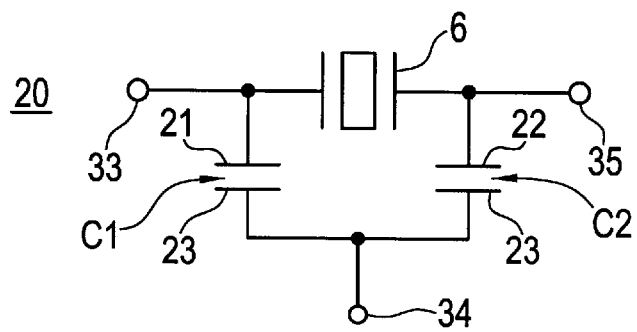
FIG. 6 is an electrical equivalent circuit diagram of the surface mount type electronic component shown in FIG. 4.

As shown in FIG. 5, the surface mounting type piezoelectric component 20, constructed as described above, is mounted on the printed circuit board 11, with the mounting surface 32a being arranged on the printed circuit board 11 side. A recess 12 is preferably provided in the printed circuit board 11, and the piezo-resonator 6 and at least a portion of the capacitor element 26 are accommodated in the recess 12. Further, circuit patterns 13, 14 and G extend onto the printed circuit board 11 from the recess 12. The anisotropic conductor 28 is pressurized and hardened, with the circuit patterns 13, 14 and G being in contact with the anisotropic conductor 28, and is attached to the printed circuit board 11, whereby the piezoelectric component 20 is fixed to the printed circuit board 11. At the same time, the external connection electrodes 33, 34 and 35 are electrically connected to the circuit patterns 13, 14 and G through the anisotropic conductor 28. FIG. 6 is an electrical equivalent circuit diagram of the piezoelectric component 20.

The surface mounting structure constructed as described above achieves the same advantages as the surface mounting structure of the first preferred embodiment. In particular, the piezo-resonator 6 and the capacitor element 26 of the piezoelectric component 20 are arranged between the insulating substrate 32 and the printed circuit board 11, and a completely enclosed oscillation space is defined by the insulating substrate 32, the printed circuit board 11 and the anisotropic conductor 28.

In the third preferred embodiment, the insulating substrate of a surface mounting type piezoelectric component has a built-in capacitor.

Figure 7:
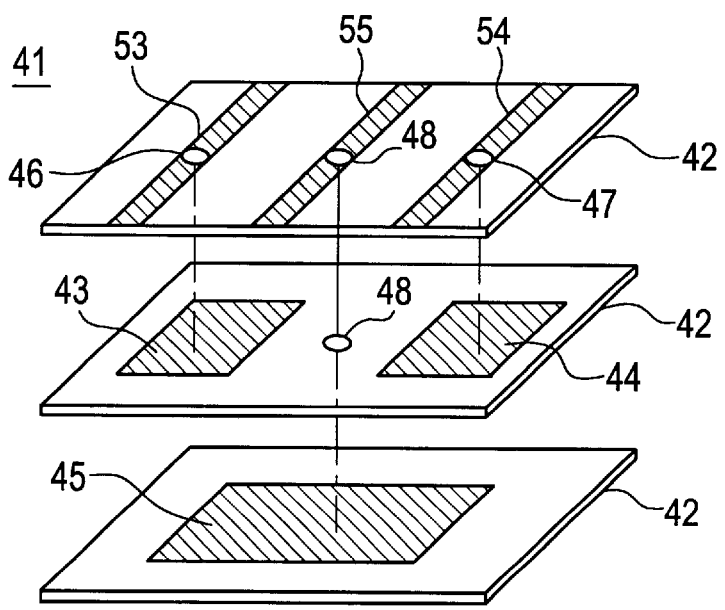
FIG. 7 is an exploded perspective view of a multilayer insulating substrate included in a third preferred embodiment of the surface mount type electronic component of the present invention.

As shown in FIG. 7, the insulating substrate 41 of a surface mounting type piezoelectric component preferably includes a dielectric sheet 42 having external connection electrodes 53, 54 and 55 on its surface, a dielectric sheet 42 having capacitor electrodes 43 and 44 on its surface, and a dielectric sheet 42 having a ground side capacitor electrode 45 on its surface. In the portion where the capacitor electrodes 43 and 45 are opposed to each other and in the portion where the capacitor electrodes 44 and 45 are opposed to each other, capacitors C1 and C2 are respectively provided. The external connection electrode 53 is electrically connected to the capacity electrode 43 through a via hole 46 provided in the dielectric sheet 42. Similarly, the external connection electrode 54 is electrically connected to the capacity electrode 44 through a via hole 47, and the external connection electrode 55 is electrically connected to the capacity electrode 45 through a via hole 48. The sheets 42 are stacked together and then integrally burned to define a multi-layer insulating substrate 41.

Figure 8:
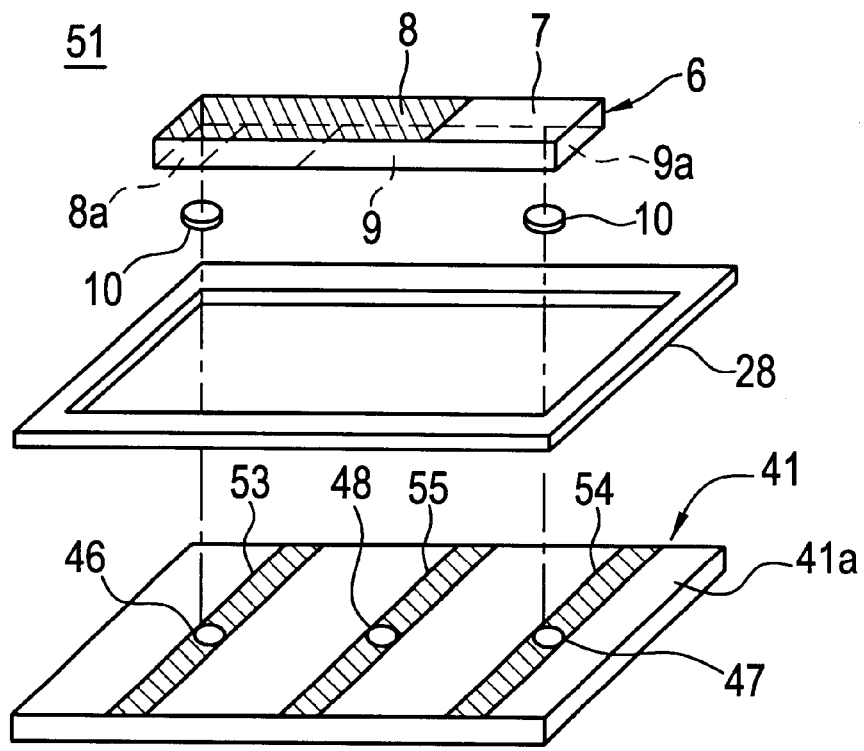
FIG. 8 is an exploded perspective view showing a surface mount type electronic component according to the third preferred embodiment.

Next, as shown in FIG. 8, the frame-shaped anisotropic conductor 28 is integrally attached to the outer peripheral portion of the mounting surface 41a of the insulating substrate 41 having a built-in capacitor, and the end portions of the external connection electrodes 53 through 55 are electrically connected to the anisotropic conductor 28. The piezo-resonator 6 is fixed to the mounting surface 41a of the insulating substrate 41 preferably via the conductive adhesive 10, and the lead-out portion 8a of the oscillation electrode 8 is electrically connected to the approximate central portion of the external connection electrode 53, the lead-out portion 9a of the oscillation electrode 9 being electrically connected to the approximate central portion of the external connection electrode 54.

Figure 9:
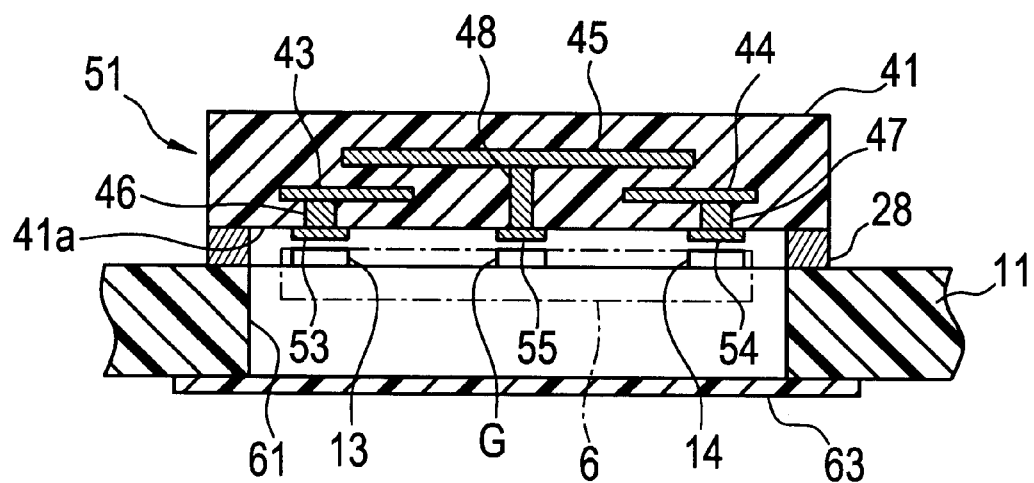
FIG. 9 is a vertical sectional view showing the mounting structure of the surface mount type electronic component shown in FIG. 8.

As shown in FIG. 9, the surface mounting type piezoelectric component 51, constructed as described above, is mounted on the printed circuit board 11, with the mounting surface 41a on which the piezo-resonator 6 is mounted being arranged on the printed circuit board 11 side. A through-hole 61 is preferably provided in the printed circuit board 11, and at least a portion of the piezo-resonator 6 is accommodated in this through-hole 61. The longitudinal and lateral dimensions of the through-hole 61 are preferably larger than those of the piezo-resonator 6 and smaller than those of the insulating substrate 41. Further, circuit patterns 13, 14 and G extend out onto the printed circuit board 11 from the through-hole 61. The anisotropic conductor 28 is pressurized and hardened, with the circuit patterns 13, 14 and G being held in contact with the anisotropic conductor 28, and is attached to the printed circuit board 11, whereby the piezoelectric component 51 is secured to the printed circuit board. At the same time, the external connection electrodes 53, 54 and 55 are electrically connected to the circuit patterns 13, 14 and G, respectively, via the anisotropic conductor 28.

The surface mounting structure constructed as described above achieves the same advantages as the surface mounting structure of the second preferred embodiment. The opening of the through-hole 61 of the printed circuit board 11 is preferably covered with a heat resisting tape 63 or other similar material as needed, whereby a completely enclosed oscillation space is defined.

Figure 10:
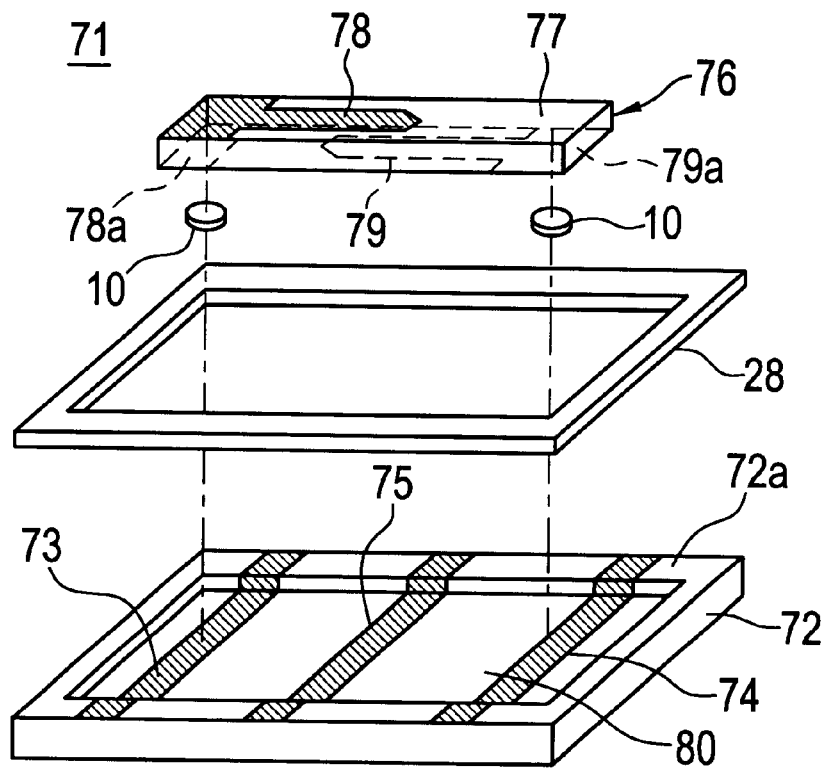
FIG. 10 is an exploded perspective view showing a fourth preferred embodiment of the surface mount type electronic component of the present invention.

As shown in FIG. 10, a surface mounting type piezoelectric component 71 preferably includes a dielectric substrate 72, a piezo-resonator 76 mounted on the dielectric substrate 72, and a frame-shaped anisotropic conductor 28. A recess 80 is preferably provided in a mounting surface 72a of the dielectric substrate 72. External connection electrodes 73, 74 and 75 extending from the front side to the rear side of the dielectric substrate 72 are respectively located at the right-hand and left-hand portions and the approximate central portion of the bottom surface of the recess 80. Capacitors C1 and C2 are respectively disposed between the external connection electrodes 73 and 75 and between the external connection electrodes 74 and 75.

The anisotropic conductor 28 is integrally attached to the outer peripheral portion of the dielectric substrate 72, and the respective end portions of the external connection electrodes 73 through 75 are electrically connected to the anisotropic conductor 28.

The piezo-resonator 76 preferably includes a piezoelectric substrate 77, and oscillation electrodes 78 and 79 are preferably provided on opposed major surfaces of the piezoelectric substrate 77. The piezo-resonator 76 vibrates in a thickness longitudinal oscillation mode. At least a portion of the piezo-resonator 76 is accommodated in the recess 80 of the dielectric substrate 72 and fixed thereto preferably via a conductive adhesive 10 or other suitable connecting material. At the same time, the lead-out portion 78a of the oscillation electrode 78 is electrically connected to the external connection electrode 73, and the lead-out portion 79a of the oscillation electrode 79 is electrically connected to the external connection electrode 74.

Figure 11:
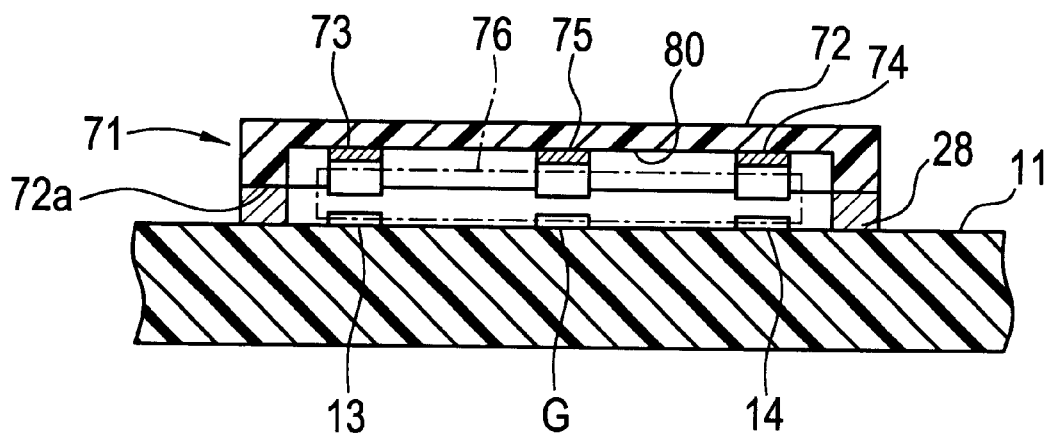
FIG. 11 is a vertical sectional view showing the mounting structure of the surface mount type electronic component shown in FIG. 10.

As shown in FIG. 11, the surface mounting type piezoelectric component 71 with a built-in capacitor, constructed as described above, is mounted on the printed circuit board 11, with the mounting surface 72a being arranged on the printed circuit board 11 side. On the printed circuit board 11, circuit patterns 13, 14 and G are provided. The anisotropic conductor 28 is attached to the printed circuit board 11, with the anisotropic conductor 28 being in contact with the circuit patterns 13, 14 and G, whereby the piezoelectric component 71 is fixed to the printed circuit board 11. At the same time, the external connection electrodes 73, 74 and 75 are electrically connected to the circuit patterns 13, 14 and G, respectively, through the anisotropic conductor 28.

The surface mounting structure constructed as described above achieves the same advantages as the surface mounting structure of the second preferred embodiment. In particular, when the piezoelectric component 71 of the fourth preferred embodiment is used, there is no need to provide a recess or a through-hole in the printed circuit board 11, so that the printed circuit board 11 can be easily designed and manufactured.

The surface mounting structure of the present invention and the surface mounting type piezoelectric component included in the surface mounting structure are not restricted to the above-described preferred embodiments. Various modifications are possible without departing from the gist of the invention. In the above preferred embodiments, it is not absolutely necessary to provide the conductive adhesive 5, the anisotropic conductor 28, etc. on the piezoelectric components 1, 20, 51 and 71. It is also possible to arrange these components integrally with the printed circuit board 11.

As is apparent from the above description, in accordance with preferred embodiments of the present invention, the second substrate provides the enclosing function and protecting function of the cover member, a component of the outer substrate, and other such functions previously performed by a conventional cover member. Thus, it is possible to omit the conventionally required cover member thereby making it possible to minimize the height of the entire surface mounting structure.

Further, by providing the first substrate with a recess for accommodating the electronic component element, or by providing the second substrate with a recess or a through-hole for accommodating the electronic component element, the effective height of the electronic component element is greatly reduced, and the height of the entire surface mounting structure is minimized.

While the invention has been particularly shown and described with reference to preferred embodiments thereof, it will be understood by those skilled in the art that the forgoing and other changes in form and details may be made therein without departing from the spirit of the invention.

What is claimed is:

1. A surface mounting structure comprising:
    a first substrate having an external connection electrode on a mounting surface thereof;
    an electronic component element mounted on the mounting surface of the first substrate and electrically connected to the external connection electrode; and
    a second substrate on which the first substrate is mounted and including a circuit pattern that is electrically connected to the external connection electrode;
    wherein the first substrate is secured to the second substrate and the external connection electrode of the first substrate is electrically connected to the circuit pattern of the second substrate, with the mounting surface of the first substrate being arranged on the second substrate side.

2. The surface mounting structure according to claim 1, further comprising an anisotropic conductor, wherein the first substrate is secured to the second substrate via the anisotropic conductor, and the external connection electrode of the first substrate is electrically connected to the circuit pattern of the second substrate via the anisotropic conductor.

3. The surface mounting structure according to claim 1, further comprising a conductive adhesive, wherein the first substrate is fixed to the second substrate via the conductive adhesive, and the external connection electrode of the first substrate is electrically connected to the circuit pattern of the second substrate via the conductive adhesive.

4. The surface mounting structure according to claim 1, wherein a recess is provided in the first substrate and at least a portion of the electronic component element is disposed in the recess.

5. The surface mounting structure according to claim 1, wherein at least one of a recess and a through-hole is provided in the second substrate and at least a portion of the electronic component element is disposed in the recess.

6. The surface mounting structure according to claim 1, wherein the electronic component element is a composite element including a piezo-resonator and a capacitor element electrically connected and fixed to each other.

7. The surface mounting structure according to claim 1, wherein the electronic component element is a piezo-resonator, and a built-in capacitor is included in the first substrate.

8. The surface mounting structure according to claim 1, wherein a major portion of the electronic component element is disposed within the first substrate.

9. The surface mounting structure according to claim 1, wherein a major portion of the electronic component element is disposed within the second substrate.

10. The surface mounting structure according to claim 1, wherein the electronic component element is one of a piezoelectric component, an inductor, a capacitor and a resistor.

11. A surface mount type electronic component comprising:
    a first substrate having an external connection electrode on a mounting surface thereof;
    an electronic component element mounted on the mounting surface of the first substrate and electrically connected to the external connection electrode; and
    a second substrate on which the first substrate is mounted and including a circuit pattern that is electrically connected to the external connection electrode;
    wherein the first substrate is secured to the second substrate and the external connection electrode of the first substrate is electrically connected to the circuit pattern of the second substrate, with the mounting surface of the first substrate being arranged on the second substrate side.

12. The surface mount type electronic component according to claim 11, wherein a frame-shaped anisotropic conductor is arranged along the outer periphery of the first substrate.

13. The surface mount type electronic component according to claim 11, wherein a recess is provided in the first substrate and at least a portion of the electronic component element is disposed in the recess.

14. The surface mount type electronic component according to claim 11, wherein at least one of a recess and a through-hole is provided in the second substrate and at least a portion of the electronic component element is disposed in the recess.

15. The surface mount type electronic component according to claim 11, wherein the electronic component element is a composite element including a piezo-resonator and a capacitor element electrically connected and fixed to each other.

16. The surface mount type electronic component according to claim 11, wherein the electronic component element is a piezo-resonator, and the first substrate has a built-in capacitor.

17. The surface mount type electronic component according to claim 11, wherein a major portion of the electronic component element is disposed within the first substrate.

18. The surface mount type electronic component according to claim 11, wherein a major portion of the electronic component element is disposed within the second substrate.

19. The surface mount type electronic component according to claim 11, wherein the electronic component element is one of a piezoelectric component, an inductor, a capacitor and a resistor.

* * * * *